United States Patent
Schuster et al.

(10) Patent No.: US 7,289,279 B2
(45) Date of Patent: Oct. 30, 2007

(54) LITHOGRAPHIC OBJECTIVE HAVING A FIRST LENS GROUP INCLUDING ONLY LENSES HAVING A POSITIVE REFRACTIVE POWER

(75) Inventors: Karl-Heinz Schuster, Königsbronn (DE); Alexander Epple, Aalen (DE)

(73) Assignee: Carl Zeiss Semiconductor Manufacturing Technologies AG, Oberkochen (DE)

( * ) Notice: Subject to any disclaimer, the term of this patent is extended or adjusted under 35 U.S.C. 154(b) by 0 days.

(21) Appl. No.: 11/350,941

(22) Filed: Feb. 10, 2006

(65) Prior Publication Data

US 2006/0176573 A1 Aug. 10, 2006

Related U.S. Application Data

(63) Continuation of application No. 10/873,292, filed on Jun. 23, 2004, now Pat. No. 7,023,627, which is a continuation of application No. 10/025,605, filed on Dec. 26, 2001, now Pat. No. 6,788,387.

(30) Foreign Application Priority Data

Dec. 22, 2000 (DE) ................................. 100 64 685

(51) Int. Cl.
G02B 3/00 (2006.01)
G02B 9/00 (2006.01)
G02B 9/34 (2006.01)

(52) U.S. Cl. ........................ 359/774; 359/649

(58) Field of Classification Search ................ 359/754, 359/772, 774, 740, 715, 649
See application file for complete search history.

(56) References Cited

U.S. PATENT DOCUMENTS

| 4,030,805 A | 6/1977 | Rogers ........................ 359/357 |
| 4,948,238 A | 8/1990 | Araki et al. |
| 5,781,278 A | 7/1998 | Matsuzawa et al. .......... 355/53 |
| 5,835,285 A | 11/1998 | Matsuzawa et al. ........ 359/754 |
| 5,920,379 A | 7/1999 | Matsuyama ................... 355/67 |
| 5,930,049 A | 7/1999 | Suenaga et al. ............. 359/650 |
| 5,969,803 A | 10/1999 | Mercado ....................... 355/67 |
| 5,986,824 A | 11/1999 | Mercado ..................... 359/754 |
| 5,990,926 A | 11/1999 | Mercado ..................... 347/258 |
| 6,008,884 A | 12/1999 | Yamaguchi et al. .......... 355/54 |
| 6,084,723 A | 7/2000 | Matsuzawa et al. ........ 359/754 |
| 6,088,171 A | 7/2000 | Kudo ........................... 355/54 |

(Continued)

FOREIGN PATENT DOCUMENTS

EP 1 006 388 6/2000

OTHER PUBLICATIONS

U.S. Appl. No. 09/452,041, filed Nov. 30, 1999.

Primary Examiner—Alicia M Harrington
(74) Attorney, Agent, or Firm—Walter Ottesen

(57) ABSTRACT

A projection objective includes a first lens group (G1) of positive refractive power, a second lens group (G2) of negative refractive power and at least one further lens group of positive refractive power in which a diaphragm is mounted. The first lens group (G1) includes exclusively lenses of positive refractive power. The number of lenses of positive refractive power (L101 to L103; L201, L202) of the first lens group (G1) is less than the number of lenses of positive refractive power (L116 to L119; L215 to L217) which are mounted forward of the diaphragm of the further lens group (G5).

9 Claims, 4 Drawing Sheets

U.S. PATENT DOCUMENTS

| | | |
|---|---|---|
| 6,198,576 B1 | 3/2001 | Matsuyama ................ 359/649 |
| 6,259,508 B1 | 7/2001 | Shigematsu ................ 355/53 |
| 6,333,781 B1 | 12/2001 | Shigematsu ................ 355/71 |
| 6,349,005 B1 | 2/2002 | Schuster et al. ............ 359/754 |
| 6,377,338 B1 | 4/2002 | Suenaga ................ 355/67 |
| RE37,846 E | 9/2002 | Matsuzawa et al. ........ 359/754 |
| 6,522,484 B1 | 2/2003 | Schuster ................ 359/733 |
| 6,538,821 B2 | 3/2003 | Takahashi ................ 359/649 |
| 6,556,353 B2 | 4/2003 | Omura ................ 359/649 |
| 6,560,031 B1 | 5/2003 | Shafer et al. ............... 359/649 |
| 6,590,745 B1 | 7/2003 | Yagi ................ 360/235.4 |
| 6,674,513 B2 | 1/2004 | Omura ................ 355/67 |
| 6,683,729 B1 * | 1/2004 | Schuster ................ 359/754 |
| 6,781,766 B2 | 8/2004 | Takahashi ................ 359/649 |
| 6,788,387 B2 | 9/2004 | Schuster et al. ............. 355/67 |
| 2002/0008861 A1 | 1/2002 | Singer et al. ................ 355/53 |
| 2002/0044260 A1 | 4/2002 | Takahashi et al. ............ 353/31 |
| 2002/0060859 A1 | 5/2002 | Yoneyama ................ 359/749 |
| 2002/0149855 A1 | 10/2002 | Schuster ................ 359/649 |
| 2002/0167650 A1 | 11/2002 | Suzuki ................ 355/53 |
| 2002/0186355 A1 | 12/2002 | Omura ................ 355/53 |
| 2003/0007253 A1 | 1/2003 | Schuster et al. ............. 359/642 |
| 2003/0030916 A1 | 2/2003 | Suenaga ................ 359/687 |
| 2003/0048547 A1 | 3/2003 | Schuster ................ 359/781 |
| 2003/0112525 A1 | 6/2003 | Reinecke et al. ............ 359/649 |
| 2003/0179462 A1 | 9/2003 | Shafer et al. ............... 359/649 |
| 2003/0227693 A1 | 12/2003 | Otomo ................ 359/772 |

* cited by examiner

US 7,289,279 B2

LITHOGRAPHIC OBJECTIVE HAVING A FIRST LENS GROUP INCLUDING ONLY LENSES HAVING A POSITIVE REFRACTIVE POWER

CROSS REFERENCE TO RELATED APPLICATIONS

This is a continuation application of application Ser. No. 10/873,292, filed Jun. 23, 2004, now U.S. Pat. No. 7,023,627, which is, in turn, a continuation application of application Ser. No. 10/025,605, filed Dec. 26, 2001, now U.S. Pat. No. 6,788,387, claiming priority from German patent application 100 64 685.9, filed Dec. 22, 2000, and all incorporated herein by reference.

FIELD OF THE INVENTION

The invention relates to a projection objective for microlithography which has at least two lens groups which have positive refractive power.

BACKGROUND OF THE INVENTION

U.S. Pat. No. 5,990,926 discloses a projection lens system for use in microlithography and this lens system has three bellied regions, that is, three lens groups of positive refractive power. The objective is viewed in the direction of the propagation of the light. Here, the first lens group includes only positive lenses and the wafer end numerical aperture is 0.6.

U.S. Pat. No. 5,969,803 discloses a projection objective for use in microlithography and this lens system includes three positive lens groups. The numerical aperture again is 0.6 and the objective here is a purely spherical objective.

U.S. Pat. No. 4,948,238 discloses an optical projection system for microlithography wherein, at the wafer end, the last two lenses have respective aspherical lens surfaces for improving imaging quality. The aspherical lens surfaces are arranged facing toward each other.

The projection systems known from the above U.S. Pat. No. 4,948,238 have a low number of lenses. Especially, the numerical aperture, which can be made available by means of this objective, is only 0.45.

SUMMARY OF THE INVENTION

It is an object of the invention to provide a projection objective for microlithography which has a high numerical aperture as well as excellent imaging qualities.

The projection objective of the invention includes: a first lens group of positive refractive power; a second lens group of negative refractive power; at least one additional lens group having positive refractive power and the one additional lens group having a diaphragm mounted therein; the first lens group including only lenses having positive refractive power; the one additional lens group having a number of lenses of positive refractive power arranged forward of the diaphragm; and, the number of lenses of positive refractive power of the first lens group being less than the number of lenses of positive refractive power of the one additional lens group arranged forward of the diaphragm.

A projection objective is provided which has an especially high numerical aperture while at the same time having a low structural length because of the following measures: a first lens group which is so configured that this lens group comprises only lenses of positive refractive power and the number of lenses of positive refractive power of the first lens group is less than the number of the positive lenses which are mounted forward of the diaphragm of the additional lens group of positive refractive power.

In the input region of the objective, an expansion of the input beam is avoided by providing the first lens group which has only lenses of positive refractive power. Because of this measure, this first lens group can be configured to be very slim, that is, the lenses have a small diameter. In this way, less material is needed in the first lens group, on the one hand, and, on the other hand, the structural space, which is needed to accommodate this lens group, is reduced. This structural space can be used to increase the numerical aperture by providing additional positive lenses forward of the diaphragm.

For an especially slimly configured first lens group, it is possible to shift the Petzval correction into these follow-on lens groups of positive refractive power because of the structural space obtained with a slight enlargement of these follow-on lens groups of positive refractive power. An especially large contribution to the Petzval correction is supplied by the positive lens group in which the diaphragm is mounted in combination with the strong beam narrowing forward of this group via a strong negative refractive power.

Preferably, the diameter of the lenses of the first lens group is less than 1.3 times the object field.

It has been shown to be advantageous to provide at least one lens having an aspheric surface in the first lens group. This aspheric surface contributes to improving the imaging quality of the objective.

It has been shown to be advantageous to provide aspheric lens surfaces in the first lens group which deviate by more than 300 μm compared to the best fitting spherical lens surface. The arrangement of such an asphere on the object end lens surface of the first lens of the lens arrangement has been shown to be advantageous. These intense asphericities close behind the reticle are especially effective in order to correct the field-dependent aberration. The extent of the asphericity is dependent upon the beam cross sections and on the input aperture which is always less than the output aperture. Even though the deviation to the sphere is great, a simple asphere form generates the most favorable contribution to the total aberration correction. As a consequence of the simple asphere form, this asphere form remains nonetheless easy to manufacture.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
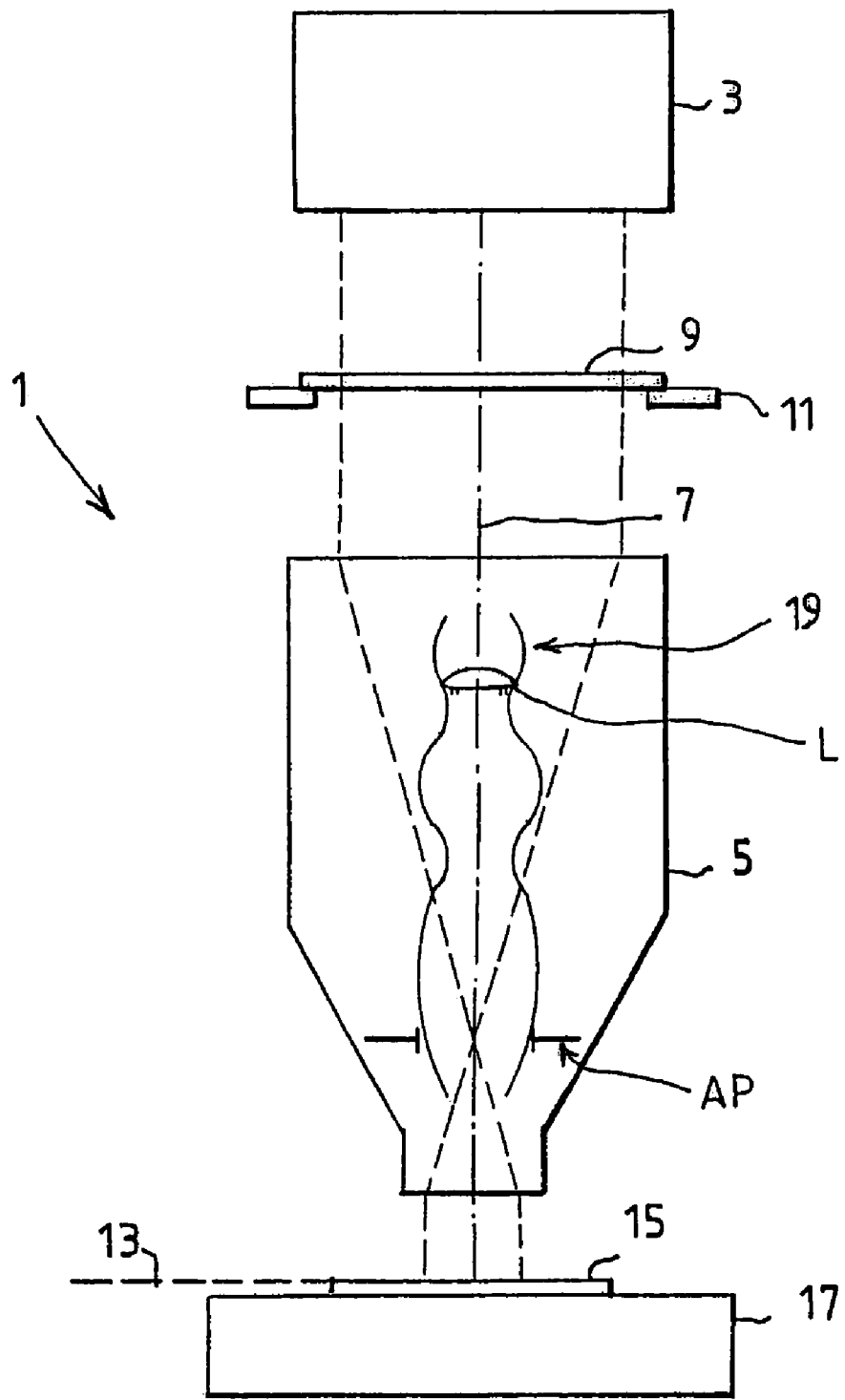
FIG. 1 is a schematic showing the assembly of a projection exposure system.

First, the configuration of a projection exposure system will be described with reference to FIG. 1.

The projection exposure system 1 includes an illuminating unit 3 and a projection objective 5. The illuminating unit can, for example, be an excimer laser having a wavelength of less than 250 nm. The projection objective 5 includes a lens arrangement 19 having an aperture diaphragm AP. An optical axis 7 is defined by the lens arrangement 19. Different lens arrangements are explained hereinafter with reference to FIGS. 2 and 3. A mask 9 is mounted between the illuminating unit 3 and the projection objective 5 and the mask is held in the beam path with the aid of a mask holder. Masks 9 used in microlithography have a micrometer-nanometer structure. This structure is imaged on an image plane 13 by means of the projection objective 5 demagnified up to a factor of 10 (demagnified especially by a factor of 4). A substrate 15 or a wafer, which is positioned by a substrate holder 17, is held in the image plane 13.

The minimal structures, which can still be resolved, are dependent upon the wavelength λ of the light, which is used for the illumination, as well as on the image-end numerical aperture of the projection objective 5. The maximum achievable resolution of the projection exposure system 1 increases with a decreasing wavelength λ of the illuminating unit 3 and with an increasing image-end numerical aperture of the projection objective 5.

According to another feature of the invention, the illumination unit can be a light source for emitting ultraviolet laser light.

Figure 2:
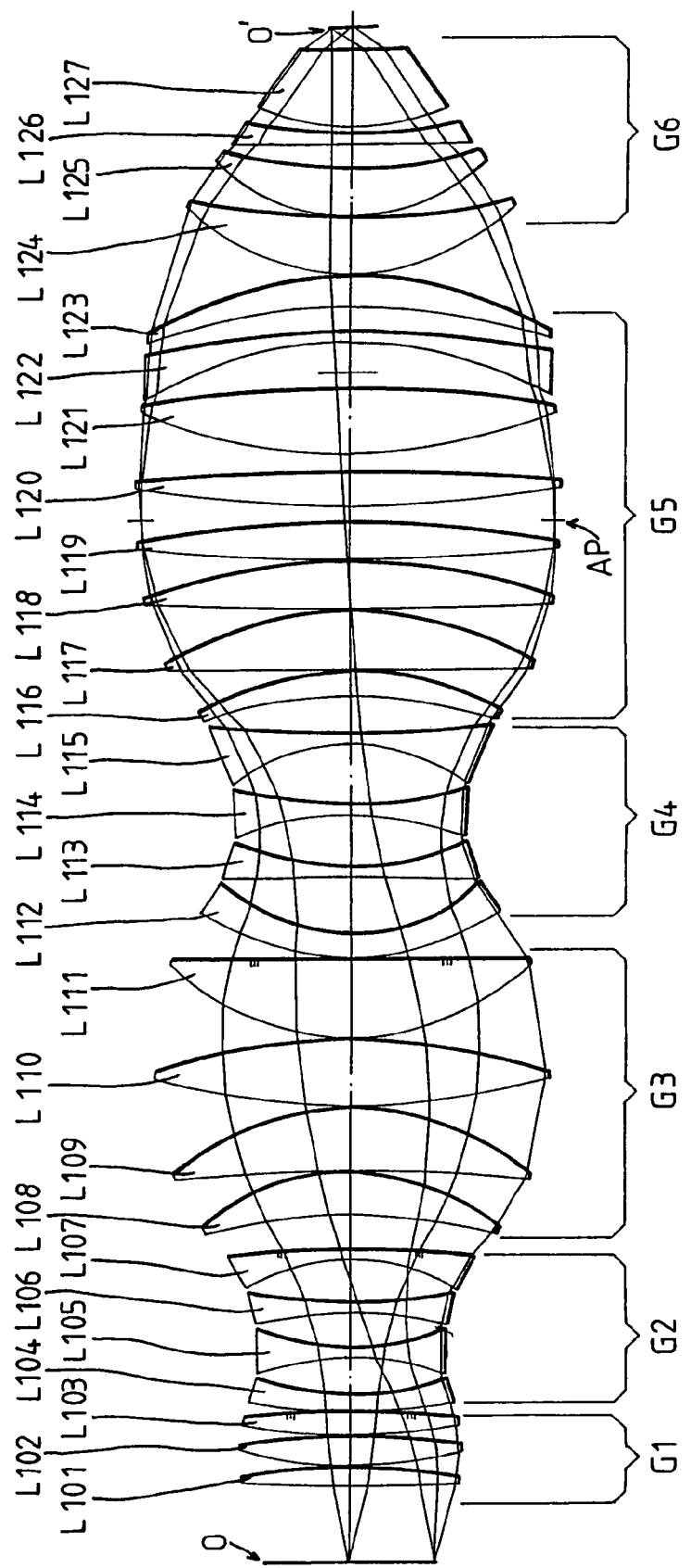
FIG. 2 is a schematic side elevation view of a projection objective for 248 nm having a numerical aperture of 0.8.

In FIG. 2, a projection objective for microlithography is shown. This objective includes six lens groups.

The first lens group includes three positive lenses L101 to L103, which are all biconvex. The last lens L103 is provided with an asphere on the image-end surface. A targeted correction of the coma in the region of the image field zone is possible via the aspheric surface provided forward of the first waist or narrowing. The aspheric lens surface has only a slight influence on the inclined spherical aberration in the tangential section and in the sagittal section. In contrast, the inclined sagittal aberration (especially in the region between the image field zone and the image field edge) can be corrected with the aspherical lens surface after the narrowing or waist.

The provision of a second aspherical lens surface is a valuable measure in order to counter, with an increased aperture, a reduction of the image quality based on coma.

The second lens group includes four lenses L104 to L107. The image-end mounted lens surface of this last lens L107 of the second lens group includes an aspheric lens surface. By means of this aspheric lens surface, especially a correction of image aberrations in the region between the image field zone and the image field edge is possible. The aberrations of higher order, which become noticeable with the observation of sagittal sections, are corrected. This is an especially valuable contribution because these aberrations, which are apparent in the sagittal section, are especially difficult to correct.

The third lens group includes the lenses L108 to L111. This lens group has a positive refractive power. The last image-end disposed lens surface of the last lens of this group is aspheric. This asphere operates, on the one hand, advantageously on the coma and, on the other hand, this asphere operates in a correcting manner on the axial aberration and on the inclined spherical aberration. The correction of the aberration is especially possible because of the large beam diameter in the region of this aspheric surface.

The following lens group having the lenses L112 to L115 has a negative refractive power.

The lens group following the above has a positive refractive power and includes lenses L116 to L123. A diaphragm is mounted in this lens group and this diaphragm is provided after the lens L119 so that four lenses of positive refractive power are mounted forward of the diaphragm. The excellent correction of the aberrations of this objective is attributable primarily to the positive lenses forward of the diaphragm. These lenses have a large component focal length because of the large diameter thereof, whereby the field loading drops and an improved correction at a higher numerical aperture is possible. These positive lenses operate, inter alia, advantageously on the coma. Furthermore, this lens group is characterized by a reduced number of lenses.

The sixth and last lens group includes the lenses L124 to L127. The precise data of the lenses are presented in Table 1. The image field is 8×26 mm. It is noted that this objective has a very significantly high numerical aperture and yet has only 27 lenses. The required space for this objective is 1000 mm. The precise lens data are presented in Table 1.

TABLE 1

| Lenses | Radius | Thickness | Material | ½ Lens Diameter | Refractive Index at 248 nm |
|---|---|---|---|---|---|
| 0 | infinite | 20.9706 | L710 | 61.246 | 0.999982 |
| L101 | 1160.20105 | 13.5756 | SIO2 | 66.130 | 1.508373 |
|  | −363.46168 | 0.7500 | L710 | 66.788 | 0.999982 |
| L102 | 256.92295 | 20.1184 | SIO2 | 68.174 | 1.508373 |
|  | −429.93637 | 0.7500 | L710 | 67.973 | 0.999982 |
| L103 | 353.94471 | 15.3795 | SIO2 | 66.245 | 1.508373 |
|  | −1064.34630 A | 0.7500 | L710 | 65.385 | 0.999982 |
| L104 | 365.62225 | 10.0788 | SIO2 | 62.164 | 1.508373 |
|  | 150.28204 | 24.6344 | L710 | 57.665 | 0.999982 |
| L105 | −160.21163 | 7.0000 | SIO2 | 57.121 | 1.508373 |
|  | 138.69010 | 21.4314 | L710 | 57.066 | 0.999982 |
| L106 | −257.68200 | 7.0000 | SIO2 | 57.709 | 1.508373 |
|  | 280.52202 | 27.7747 | L710 | 62.688 | 0.999982 |
| L107 | −122.86419 | 7.000 | SIO2 | 64.152 | 1.508373 |
|  | −524.02005 A | 21.2270 | L710 | 75.975 | 0.999982 |
| L108 | −334.99360 | 27.7619 | SIO2 | 88.903 | 1.508373 |
|  | −142.00372 | 0.7500 | L710 | 92.514 | 0.999982 |
| L109 | −1079.51219 | 40.8554 | SIO2 | 109.187 | 1.508373 |
|  | −172.00795 | 0.7500 | L710 | 111.327 | 0.999982 |
| L110 | 438.67858 | 43.4000 | SIO2 | 122.583 | 1.508373 |
|  | −378.94602 | 0.7500 | L710 | 122.708 | 0.999982 |

TABLE 1-continued

| Lenses | Radius | Thickness | Material | ½ Lens Diameter | Refractive Index at 248 nm |
|---|---|---|---|---|---|
| L111 | 162.42382 | 51.1885 | SIO2 | 113.015 | 1.508373 |
|  | −5736.26278 A | 0.7500 | L710 | 110.873 | 0.999982 |
| L112 | 165.15494 | 14.7530 | SIO2 | 92.577 | 1.508373 |
|  | 110.95539 | 37.6018 | L710 | 79.631 | 0.999982 |
| L113 | −2352.60464 | 7.0000 | SIO2 | 78.360 | 1.508373 |
|  | 158.84317 | 34.9167 | L710 | 71.086 | 0.999982 |
| L114 | −168.34448 | 7.0000 | SIO2 | 70.590 | 1.508373 |
|  | 245.44885 | 39.3735 | L710 | 71.824 | 0.999982 |
| L115 | −113.75821 | 7.0000 | SIO2 | 72.408 | 1.508373 |
|  | 666.85880 | 23.5469 | L710 | 88.173 | 0.999982 |
| L116 | −278.47485 | 16.7462 | SIO2 | 90.415 | 1.508373 |
|  | −195.62311 | 0.7500 | L710 | 95.097 | 0.999982 |
| L117 | 1596621.30490 | 37.6629 | SIO2 | 113.071 | 1.508373 |
|  | −223.02293 | 0.7500 | L710 | 115.353 | 0.999982 |
| L118 | 2651.21287 | 31.3744 | SIO2 | 127.060 | 1.508373 |
|  | −371.06734 | 0.7500 | L710 | 128.117 | 0.999982 |
| L119 | 1313.12466 | 25.1961 | SIO2 | 131.302 | 1.508373 |
|  | −666.16100 | 0.0 |  | 131.498 | 1.000000 |
|  | infinite | 9.5632 | L710 | 130.856 | 0.999982 |
| Diaphragm |  | 0.0 |  | 130.856 |  |
| L120 | 812.62806 | 22.4028 | SIO2 | 132.498 | 1.508373 |
|  | −1458.91764 | 10.9629 | L710 | 132.481 | 0.999982 |
| L121 | 344.45037 | 42.1137 | SIO2 | 130.307 | 1.508373 |
|  | −765.47811 | 29.1268 | L710 | 129.380 | 0.999982 |
| L122 | −250.24553 | 7.000 | SIO2 | 127.451 | 1.508373 |
|  | −632.30447 | 15.5964 | L710 | 127.304 | 0.999982 |
| L123 | −398.61314 | 20.5840 | SIO2 | 126.393 | 1.508373 |
|  | −242.62300 | 1.2010 | L710 | 126.606 | 0.999982 |
| L124 | 143.95358 | 37.1050 | SIO2 | 103.455 | 1.508373 |
|  | 419.96225 | 0.8946 | L710 | 100.698 | 0.999982 |
| L125 | 120.37736 | 30.9217 | SIO2 | 85.039 | 1.508373 |
|  | 263.87928 | 14.8885 | L710 | 79.055 | 0.999982 |
| L126 | 1886.79345 | 7.6305 | SIO2 | 74.319 | 1.508373 |
|  | 277.58693 | 3.7474 | L710 | 65.935 | 0.999982 |
| L127 | 144.27214 | 50.1938 | SIO2 | 58.929 | 1.508373 |
|  | 423.41846 | 15.0000 | L710 | 32.250 | 0.999982 |
| 0' | infinite | 0.0001 | L710 | 13.602 * | 0.999982 |

L710 is air at 950 mbar.

ASPHERE L103:

EX = 0
C1 = −0.10457918*10$^{-6}$
C2 = 0.37706931*10$^{-11}$
C3 = 0.61848526*10$^{-16}$
C4 = −0.13820933*10$^{-19}$
C5 = 0.36532387*10$^{-24}$
C6 = −0.11262277*10$^{-28}$

ASPHERE L107:

EX = 0.4532178*10$^{2}$
C1 = 0.19386780*10$^{-7}$
C2 = −0.22407622*10$^{-11}$
C3 = −0.42016344*10$^{-15}$
C4 = 0.45154959*10$^{-19}$
C5 = −0.19814724*10$^{-23}$
C6 = −0.43279363*10$^{-28}$

ASPHERE L111:

EX = 0
C1 = 0.57428624*10$^{-8}$
C2 = 0.22697489*10$^{-12}$
C3 = −0.71160755*10$^{-18}$
C4 = −0.72410634*10$^{-21}$
C5 = 0.32264998*10$^{-25}$
C6 = −0.55715555*10$^{-30}$

The aspheric surfaces are described by the equation:

$$P(h) = \frac{\delta \cdot h \cdot h}{1 + \sqrt{1 - (1-EX) \cdot \delta \cdot \delta \cdot h \cdot h}} + C_1 h^4 + \ldots + C_n h^{2n+2} \qquad \delta = 1/R$$

wherein: P is the arrow height as a function of the radius h (height to the optical axis 7) with the aspherical constants $C_1$ to $C_n$ presented in Table 1; R is the apex radius and is given in the table.

Figure 3:
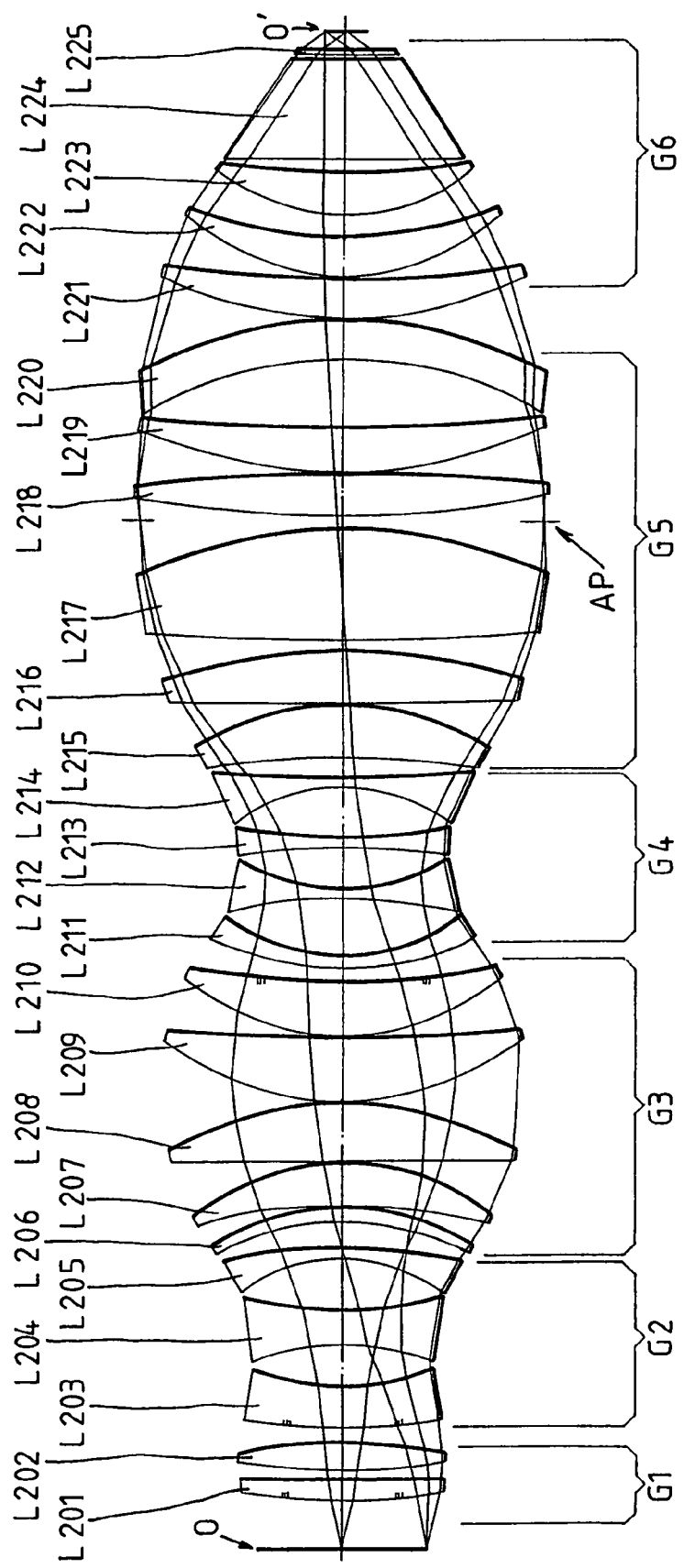
FIG. 3 is a schematic side elevation view of a projection objective for 193 nm having a numerical aperture of 0.8; and, FIG. 4 is a schematic side elevation view of another projection objective for 248 nm having a numerical aperture of 0.8.

In FIG. 3, a projection objective is shown for the wavelength 193 nm and has a numerical aperture of 0.8. A field of 8×26 can be exposed by means of this objective. The required structural space of this objective is 1000 mm.

The first lens group includes only two positive lenses and both are biconvex. The first lens L201 of this lens group G1 is provided with an aspheric lens surface at the object end.

The second lens group G2 includes the lenses L203 to L205. The lens L203 is provided with an aspheric lens surface at the object end. Because of the two aspheric lens surfaces of the lenses L201 and L203, which are provided in the first and second lens groups (G1, G2), respectively, and are arranged so as to be close to the field, an excellent beam separation in the input region of the objective is obtained. The arrangement of the aspheric lens surfaces on the side, which faces to the object, affords the advantage that the lenses, which have an aspheric lens surface, lie with the spherical lens surface against a lens frame. In this way, an excellent contact engagement on the lens frame with the spherical lens surface can be more easily ensured.

The third lens group G3 includes the lenses L206 to L210. This lens group has a positive refractive power. The two lenses L208 and L209 have two surfaces greatly curved toward each other. The last lens L210 of this lens group includes, at the image end, an aspheric lens surface. An excellent coma correction can be carried out by means of this aspheric lens surface. Furthermore, a correction of the axial and inclined spherical aberrations is especially possible in this region because of the large beam diameters.

The fourth lens group includes lenses L211 to L214. This lens group overall has a negative refractive power. In the next and fifth lens group G5, which includes the lenses L215 to L220, the diaphragm is mounted after the lens L217. This lens group includes three positive lenses and the last lens forward of the diaphragm is configured to be especially thick. The last lens group G6 includes the lenses L221 to L225 and the lens L224 is configured to be especially thick. An intense spherical overcorrection is obtained with this lens.

The precise lens data is presented in Table 2.

TABLE 2

| Lenses | Radius | Thickness | Material | ½ Lens Diameter | Refractive Index at 193 nm |
|---|---|---|---|---|---|
| 0 | infinite | 32.7500 | L710 | 61.249 | 0.999982 |
| L201 | 469.70813 A | 14.5480 | SIO2 | 62.591 | 1.560289 |
|  | −20081.10295 | 5.1612 | HE | 63.071 | 0.999712 |
| L202 | 354.86345 | 18.8041 | SIO2 | 63.983 | 1.560289 |
|  | −334.15750 | 9.4004 | HE | 63.889 | 0.999712 |
| L203 | 381.44025 A | 28.0599 | SIO2 | 61.107 | 1.560289 |
|  | 140.16853 | 27.1615 | HE | 55.898 | 0.999712 |
| L204 | −149.89590 | 23.2652 | SIO2 | 55.910 | 1.560289 |
|  | 229.41466 | 33.1065 | HE | 62.024 | 0.999712 |
| L205 | −105.40274 | 7.0000 | SIO2 | 63.462 | 1.560289 |
|  | −336.55620 | 16.9549 | HE | 74.238 | 0.999712 |
| L206 | −165.03805 | 10.7419 | SIO2 | 78.416 | 1.560289 |
|  | −147.21753 | 0.7575 | HE | 82.164 | 0.999712 |
| L207 | −314.39712 | 27.7710 | SIO2 | 90.707 | 1.560289 |
|  | −145.41305 | 0.7500 | HE | 94.176 | 0.999712 |
| L208 | −50326.68803 | 38.7705 | SIO2 | 107.592 | 1.560289 |
|  | −211.33124 | 0.7500 | HE | 109.537 | 0.999712 |
| L209 | 184.32395 | 41.8364 | SIO2 | 112.438 | 1.560289 |
|  | 1282.45923 | 0.7500 | HE | 110.470 | 0.999712 |
| L210 | 153.97703 | 35.8150 | SIO2 | 99.821 | 1.560289 |
|  | 538.04124 A | 8.4636 | HE | 95.507 | 0.999712 |
| L211 | 180.72102 | 7.8641 | SIO2 | 82.558 | 1.560289 |
|  | 116.94830 | 38.5761 | HE | 73.768 | 0.999712 |
| L212 | −292.06054 | 7.0000 | SIO2 | 71.989 | 1.560289 |
|  | 121.89815 | 26.8278 | HE | 65.096 | 0.999712 |
| L213 | −416.86096 | 7.0000 | SIO2 | 65.191 | 1.560289 |
|  | 320.06306 | 34.0097 | HE | 66.681 | 0.999712 |
| L214 | −106.74033 | 7.1599 | SIO2 | 67.439 | 1.560289 |
|  | 842.66128 | 12.4130 | HE | 82.767 | 0.999712 |
| L215 | −531.44217 | 35.2270 | SIO2 | 84.311 | 1.560289 |
|  | −173.85357 | 0.7500 | HE | 93.111 | 0.999712 |
| L216 | 5293.05144 | 34.6817 | SIO2 | 109.462 | 1.560289 |
|  | −359.30358 | 5.8421 | HE | 114.271 | 0.999712 |
| L217 | 1423.10335 | 73.8658 | SIO2 | 123.709 | 1.560289 |
|  | −302.64507 | 11.7059 | HE | 130.054 | 0.999712 |
|  | infinite | −4.1059 | HE | 129.751 | 0.999712 |
|  | infinite | 0.0000 |  | 129.751 |  |
| L218 | 644.68375 | 29.3314 | SIO2 | 130.947 | 1.560289 |
|  | −1224.04524 | 0.7500 | HE | 130.998 | 0.999712 |
| L219 | 324.02485 | 28.7950 | SIO2 | 129.211 | 1.560289 |
|  | 1275.35626 | 44.6599 | HE | 127.668 | 0.999712 |
| L220 | −246.29714 | 25.7695 | SIO2 | 126.964 | 1.560289 |
|  | −260.21284 | 0.7500 | HE | 129.065 | 0.999712 |
| L221 | 265.62632 | 25.9894 | SIO2 | 115.965 | 1.560289 |
|  | 689.74229 | 1.8638 | HE | 113.297 | 0.999712 |
| L222 | 148.08236 | 25.7315 | SIO2 | 100.768 | 1.560289 |
|  | 256.32650 | 14.8743 | HE | 97.685 | 0.999712 |
| L223 | 130.15491 | 28.8792 | SIO2 | 81.739 | 1.560289 |
|  | 554.81058 | 6.6463 | HE | 77.855 | 0.999712 |
| L224 | infinite | 67.6214 | CAF2HL | 76.291 | 1.501436 |
|  | infinite | 0.9000 | HE | 33.437 | 0.999712 |
| L225 | infinite | 4.0000 | SIO2 | 32.220 | 1.560289 |
| 0' | infinite |  | L710 | 29.816 | 0.999982 |

L710 is air at 950 mbar.

ASPHERE L201:

EX = 0
C1 = 0.98184588*10^{-7}
C2 = −0.34154428*10^{-11}
C3 = 0.15764865*10^{-15}
C4 = 0.22232520*10^{-19}
C5 = −0.79813714*10^{-23}
C6 = 0.71685766*10^{-27}

ASPHERE L203:

EX = 0
C1 = 0.26561042*10^{-7}
C2 = 0.78262804*10^{-12}
C3 = −0.24383904*10^{-15}
C4 = −0.24860738*10^{-19}
C5 = 0.820928858*10^{-23}
C6 = −0.85904366*10^{-27}

ASPHERE L210:

EX = 0
C1 = 0.20181058*10^{-7}
C2 = −0.73832637*10^{-12}
C3 = 0.32441071*10^{-17}
C4 = −0.10806428*10^{-21}
C5 = −0.48624119*10^{-25}
C6 = 0.10718490*10^{-2}

Figure 4:
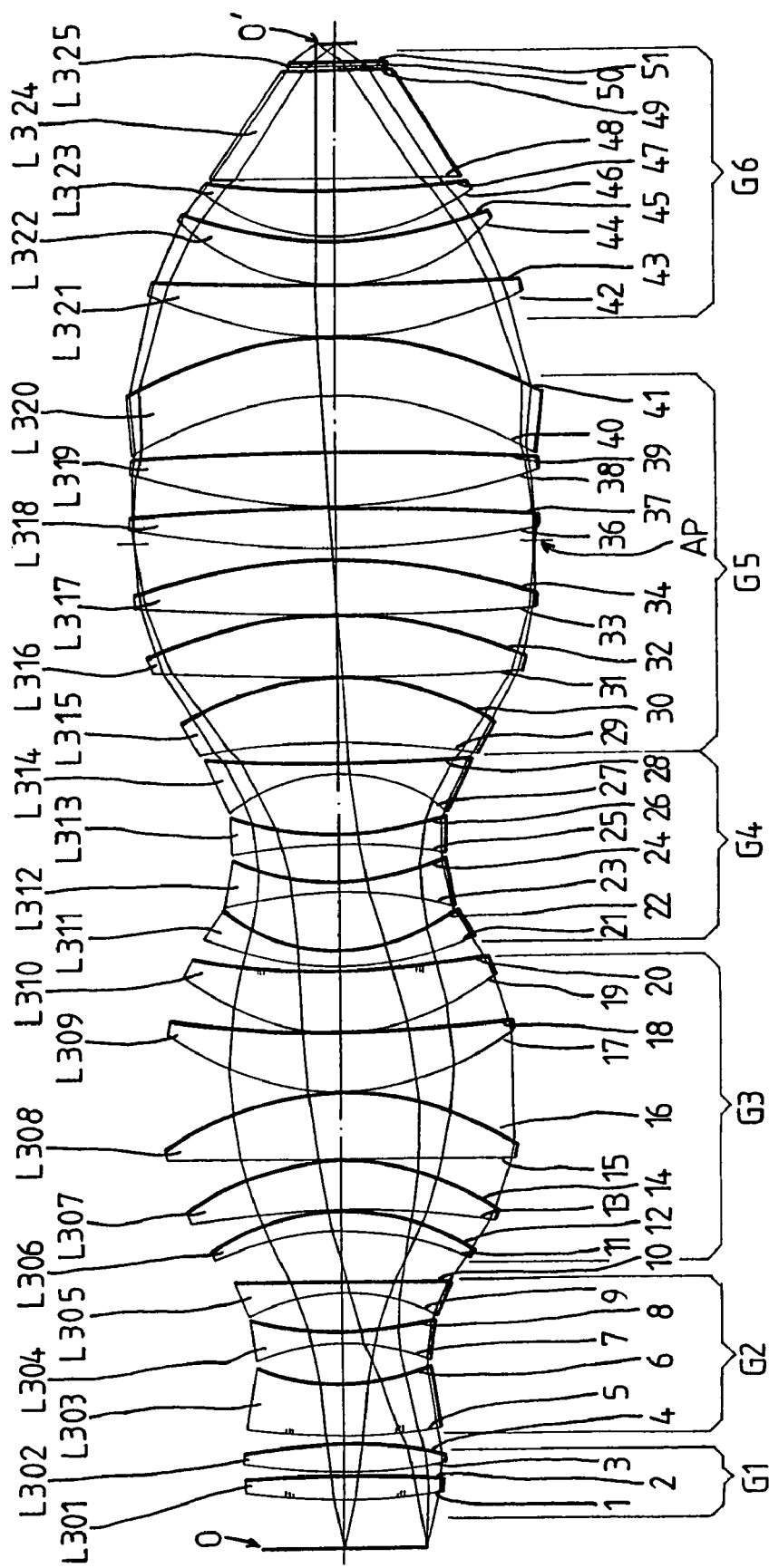

In FIG. 4, a further lens arrangement 19 is shown which is designed for the wavelength 248 nm. This lens arrangement includes 25 lenses which can be subdivided into six lens groups. The structural length of this lens arrangement from object plane 0 to image plane 0' is 1000 mm. The numerical aperture of this lens arrangement is 0.8 of the image end.

The first lens group G1 includes two positive, biconvex lenses L301 and L302. The lens L301 is provided with an aspheric lens surface at the object end.

The second lens group G2 has negative refractive power and includes the lenses L303 to L305. The lens L303 is provided with an aspherical lens surface at the object side. An excellent correction of field aberrations is possible with these two aspheric lens surfaces of the lenses L301 and L303. Furthermore, a clear beam separation is achieved because of these aspheres mounted close to the field.

The third lens group G3 includes the lenses L306 to L310 and has a positive refractive power. The lens L310 is provided with an aspheric lens surface at the image end. By means of this aspheric lens surface, an especially good correction of the coma and the axial and inclined spherical aberrations is possible. An arbitrated correction between axial and inclined spherical aberrations is especially possible because of the large beam diameters which are, however, significantly less than the clear lens diameters.

The fourth lens group G4 comprises the lenses L311 to L314 and has a negative refractive power.

The fifth lens group G5 includes the lenses L315 to L320 and has an overall positive refractive power. A diaphragm AP is mounted after the lens L317. By providing the clear air space between lens L317 and lens L318, it is possible to arrange a slide diaphragm between these two lenses.

The sixth lens group G6 includes the lenses L321 to L325. This lens group likewise has a positive refractive power. The meniscus lenses L321 to L323 are curved on both sides toward the object. This lens group includes only concave lenses which effect a field-independent, intense spherical overcorrection. For objectives having a high aperture, a correction of the spherical aberration also of higher order is possible by means of such conversion lenses.

This objective is especially well corrected especially because of the use of the aspheric lens surfaces as well as because of the specific arrangement of the number of positive lenses of the first lens group and because of the higher number of positive lenses forward of the diaphragm. The deviation from the wavefront of an ideal spherical wave is a maximum of 5.0 m$\lambda$ for a wavelength of 248 nm.

Preferably, the aspheric lens surfaces are arranged on the forward lens surface whereby the corresponding lens lies with its spherical lens surface on the frame surface. In this way, these aspherical lenses can be framed with standard frames. The precise lens data are presented in Table 3.

TABLE 3

| M1652a SURFACE | RADII | | THICKNESSES | GLASSES | REFRACTIVE INDEX 248.338 nm | ½ FREE DIAMETER |
|---|---|---|---|---|---|---|
| 0 | infinite | | 32.750000000 | L710 | 0.99998200 | 54.410 |
| 1 | 480.223886444 | AS | 16.335451604 | SIO2 | 1.50839641 | 62.519 |
| 2 | −1314.056977504 | | 2.406701682 | L710 | 0.99998200 | 63.128 |
| 3 | 329.047567482 | | 20.084334424 | SIO2 | 1.50839641 | 63.870 |
| 4 | −305.091682732 | | 4.977873027 | L710 | 0.99998200 | 63.737 |
| 5 | 383.800850809 | AS | 34.498893572 | SIO2 | 1.50839641 | 61.345 |
| 6 | 132.468446407 | | 27.572735356 | L710 | 0.99998200 | 54.949 |
| 7 | −146.238861297 | | 7.000000000 | SIO2 | 1.50839641 | 54.908 |
| 8 | 202.067070373 | | 26.902804948 | L710 | 0.99998200 | 58.294 |
| 9 | −124.60415239 | | 7.000000000 | SIO2 | 1.50839641 | 59.529 |
| 10 | −9484.579900199 | | 32.328722869 | L710 | 0.99998200 | 69.147 |
| 11 | −199.920035154 | | 13.239699068 | SIO2 | 1.50839641 | 80.852 |
| 12 | −156.061108055 | | 0.750000376 | L710 | 0.99998200 | 84.387 |
| 13 | −647.599685325 | | 32.765465982 | SIO2 | 1.50839641 | 96.077 |
| 14 | −169.327287667 | | 0.750000000 | L710 | 0.99998200 | 99.492 |
| 15 | 54987.154632328 | | 43.791248851 | SIO2 | 1.50839641 | 110.237 |
| 16 | −198.179168899 | | 0.750000000 | L710 | 0.99998200 | 112.094 |
| 17 | 179.965671297 | | 37.961498762 | SIO2 | 1.50839641 | 110.618 |
| 18 | 730.008903751 | | 0.750000000 | L710 | 0.99998200 | 108.526 |
| 19 | 155.802150060 | | 40.190627192 | SIO2 | 1.50839641 | 99.471 |
| 20 | 525.570694901 | AS | 3.398727679 | L710 | 0.99998200 | 93.056 |
| 21 | 210.625893853 | | 10.671567855 | SIO2 | 1.50839641 | 85.361 |
| 22 | 118.365024068 | | 39.388505884 | L710 | 0.99998200 | 74.596 |
| 23 | −290.993996128 | | 7.000000000 | SIO2 | 1.50839641 | 72.941 |
| 24 | 153.643732808 | | 24.440280468 | L710 | 0.99998200 | 67.256 |

TABLE 3-continued

| M1652a SURFACE | RADII | THICKNESSES | GLASSES | REFRACTIVE INDEX 248.338 nm | ½ FREE DIAMETER |
|---|---|---|---|---|---|
| 25 | −364.763623225 | 7.000000000 | SIO2 | 1.50839641 | 67.177 |
| 26 | 201.419421908 | 40.566258495 | L710 | 0.99998200 | 68.276 |
| 27 | −109.336657265 | 7.000000000 | SIO2 | 1.50839641 | 69.319 |
| 28 | 1061.293067334 | 13.765515688 | L710 | 0.99998200 | 84.656 |
| 29 | −569.739152405 | 43.187833722 | SIO2 | 1.50839641 | 87.749 |
| 30 | −187.461049756 | 0.750000000 | L710 | 0.99998200 | 99.718 |
| 31 | 1880.153525684 | 40.009394091 | SIO2 | 1.50839641 | 117.515 |
| 32 | −286.975850149 | 0.750000000 | L710 | 0.99998200 | 120.535 |
| 33 | 1960.535354230 | 35.788625356 | SIO2 | 1.50839641 | 127.909 |
| 34 | −378.322213808 | 11.705900000 | L710 | 0.99998200 | 129.065 |
| 35 | infinite | −4.105900000 | L710 | 0.99998200 | 129.546 |
| 36 | 665.988216308 | 27.299895961 | SIO2 | 1.50839641 | 130.708 |
| 37 | −1514.956732781 | 0.750000000 | L710 | 0.99998200 | 130.863 |
| 38 | 392.166724592 | 35.529695156 | SIO2 | 1.50839641 | 130.369 |
| 39 | −2215.367253951 | 37.377386813 | L710 | 0.99998200 | 129.155 |
| 40 | −235.632993037 | 38.989537996 | SIO2 | 1.50839641 | 128.458 |
| 41 | −252.020337993 | 0.835229633 | L710 | 0.99998200 | 131.819 |
| 42 | 269.631401556 | 32.688617719 | SIO2 | 1.50839641 | 118.998 |
| 43 | 1450.501345093 | 0.750000001 | L710 | 0.99998200 | 116.187 |
| 44 | 138.077824305 | 29.652384517 | SIO2 | 1.50839641 | 100.161 |
| 45 | 255.416969175 | 2.589243681 | L710 | 0.99998200 | 96.793 |
| 46 | 139.090220366 | 30.752909421 | SIO2 | 1.50839641 | 86.930 |
| 47 | 560.532964454 | 8.142484947 | L710 | 0.99998200 | 82.293 |
| 48 | infinite | 73.619847203 | SIO2 | 1.50839641 | 79.524 |
| 49 | infinite | 0.900000000 | L710 | 0.99998200 | 33.378 |
| 50 | infinite | 4.000000000 | SIO2 | 1.50839641 | 32.173 |
| 51 | infinite | 12.000000000 | L710 | 0.99998200 | 29.666 |
| 52 | infinite | | | | 13.603 |

L710 is air at 950 mbar.

| ASPHERIC CONSTANTS | | | |
|---|---|---|---|
| SURFACE NO. 1 | | | |
| EX | 0.0000 | C1 | 9.53339646e−008 |
| C2 | −3.34404782e−012 | C3 | 1.96004118e−016 |
| C4 | 8.21742864e−021 | C5 | −5.28631864e−024 |
| C6 | 4.96925973e−028 | C7 | 0.00000000e+000 |
| C8 | 0.00000000e+000 | C9 | 0.00000000e+000 |
| SURFACE NO. 5 | | | |
| EX | 0.0000 | | |
| C1 | 2.89631842e−008 | C2 | 7.74237590e−013 |
| C3 | −2.72916513e−016 | C4 | −8.20523716e−021 |
| C5 | 4.42916563e−024 | C6 | −5.10235191e−028 |
| C7 | 0.00000000e+000 | C8 | 0.00000000e+000 |
| C9 | 0.00000000e+000 | | |
| SURFACE NO. 20 | | | |
| Ex | 0.0000 | | |
| C1 | 1.99502967e−008 | | |
| C2 | −7.64732709e−013 | | |
| C3 | 3.50640997e−018 | | |
| C4 | −2.76255251e−022 | | |
| C5 | −3.64439666e−026 | | |
| C6 | 5.10177997e−031 | | |
| C7 | 0.00000000e+000 | | |

It is understood that the foregoing description is that of the preferred embodiments of the invention and that various changes and modifications may be made thereto without departing from the spirit and scope of the invention as defined in the appended claims.

What is claimed is:

1. A projection objective defining an image plane and comprising, in sequence:
   an object plane;
   a first lens group of positive refractive power adjacent said object plane;
   a second lens group of negative refractive power;
   a third lens group of positive refractive power including meniscus lenses;
   at least one additional lens group having positive refracting power and having a diaphragm mounted therein;
   said second lens group including a plurality of negative lenses;
   said projection objective defining an image plane;
   a distance between each negative lens of said second lens group;
   said distance between each negative lens of said second lens group and said image plane being greater than 54 percent of the object plane to image plane distance; and,
   a lens of one of said lens groups being an aspheric lens.

2. A projection objective defining an image plane and comprising, in sequence:
   an object plane;
   a first lens group of positive refractive power adjacent said object plane;
   a second lens group of negative refractive power;
   a third lens group of positive refractive power consisting of meniscus lenses;
   at least one additional lens group having positive refracting power and having a diaphragm mounted therein; and,
   said projection objective having a numerical aperture of at least 0.8.

3. A projection objective defining an optical axis and an image plane and comprising:
   an object plane;
   a plurality of lenses arranged along said optical axis;
   a diaphragm interposed between two of said lenses;
   a first one of said lenses being an aspheric lens;
   a second one of said lenses being arranged between said diaphragm and the image plane; and,
   said second lens having a thickness of about at least 6 cm.

4. The projection objective of claim 3, wherein said thickness of said second lens is measured at said optical axis.

5. The projection objective of claim 4, wherein said second lens has a varying thickness.

6. The projection objective of claim 4, wherein said second lens is a plane-parallel plate.

7. A projection objective defining an optical axis and an image plane and comprising:
   an object plane;
   a plurality of lenses arranged along said optical axis;
   a diaphragm interposed between two of said lenses;
   a first one of said lenses being an aspheric lens;
   a second one of said lenses being arranged between said diaphragm and the image plane;
   said second lens having a thickness of about at least 6 cm; and,
   said projection objective having a numerical aperture of at least 0.8.

8. A projection objective defining an optical axis and an image plane and comprising:
   an object plane;
   a plurality of lenses arranged along said optical axis;
   a diaphragm interposed between two of said lenses;
   a first one of said lenses being an aspheric lens;
   a second one of said lenses being arranged between said diaphragm and the image plane;
   said second lens having a thickness of about at least 6 cm; and,
   a plane-parallel plate.

9. The projection objective of claim 8, wherein said plane-parallel plate follows said second lens.

* * * * *